United States Patent
Hsiao et al.

(10) Patent No.: US 11,239,125 B2
(45) Date of Patent: Feb. 1, 2022

(54) CARRIER STRUCTURE AND PACKAGE STRUCTURE

(71) Applicant: Siliconware Precision Industries Co., Ltd., Taichung (TW)

(72) Inventors: Hsien-Lung Hsiao, Taichung (TW); Yu-Cheng Pai, Taichung (TW); Chia-Chi Lo, Taichung (TW); Szu-Hsien Chen, Taichung (TW); Shu-Chi Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 104 days.

(21) Appl. No.: 16/232,735

(22) Filed: Dec. 26, 2018

(65) Prior Publication Data

US 2020/0035573 A1    Jan. 30, 2020

(30) Foreign Application Priority Data

Jul. 27, 2018 (TW) .................. 107126152

(51) Int. Cl.
*H01L 23/13* (2006.01)
*H01L 23/498* (2006.01)
*H01L 23/00* (2006.01)
*H01L 23/60* (2006.01)

(52) U.S. Cl.
CPC ........ *H01L 23/13* (2013.01); *H01L 23/49822* (2013.01); *H01L 23/49838* (2013.01); *H01L 23/60* (2013.01); *H01L 24/94* (2013.01)

(58) Field of Classification Search
None
See application file for complete search history.

(56) References Cited

U.S. PATENT DOCUMENTS

2003/0091673 A1* 5/2003 Hung ............... H01L 23/60
                                              425/117
2008/0018849 A1* 1/2008 Igarashi ........... G02F 1/13452
                                              349/149

* cited by examiner

*Primary Examiner* — Alexander G Ghyka
(74) *Attorney, Agent, or Firm* — Mintz Levin Cohn Ferris Glovsky and Popeo, P.C.; Peter F. Corless; Steven M. Jensen

(57) ABSTRACT

A carrier structure includes: a plurality of substrates; a separation portion provided between the substrates; and a periphery portion provided at the periphery of the substrates and formed with at least one opening. With the configuration of the opening, the area of an insulating layer of the carrier structure can be reduced. Therefore, the overall space of electrostatic buildup in the carrier structure can also be reduced.

14 Claims, 4 Drawing Sheets

CARRIER STRUCTURE AND PACKAGE STRUCTURE

CROSS-REFERENCE TO RELATED APPLICATION

This Application claims under 35 U.S.C. § 119(a) the benefit of Taiwanese Patent Application No. 107126152 filed on Jul. 27, 2018. The entire contents of these applications are incorporated herein by reference in their entirety.

BACKGROUND

1. Technical Field

The present disclosure relates to packaging techniques, and, more particularly, to a semiconductor package structure and a carrier structure thereof.

2. Description of Related Art

In current semiconductor packaging processes, packaging substrate strips are designed with electroplated buses and electroplated bridge connections for electroplating patterned metal layers, wherein these electroplated buses extend to the sides of the substrate strip.

As shown in FIGS. 1A and 1A', a substrate strip includes: a plurality of die attach regions 1a, separation regions 1b connected between various die attach regions 1a, and a periphery region 1c surrounding the peripheries of the die attach regions 1a and the separation regions 1b. A plurality of substrates 10a are arranged in an array in the die attach regions 1a, and electroplated buses 13 are provided in the periphery region 1c. Each of the substrates 10 includes a dielectric body 100 and wiring layers 101 disposed in the dielectric body 100.

In the packaging process, the substrate strip is conveyed along a track (not shown), so that a semiconductor element 11 can be placed on each of the substrates 10 and connected to the respective one of the substrates 10; and then encapsulant 12 is applied for encapsulating the semiconductor elements 11 to form packaging structures 1. Thereafter, the periphery region 1c is cut off, and singulation is performed by dicing along the separation regions 1b to obtain a plurality of semiconductor packages.

However, in the conventional packaging process, the body of the substrate 10 (the dielectric body 100) is a polymer composite. During the packaging process, operations such as rubbing/sucking, placement, etc. often lead to build up of high static voltage in the polymer composite. After the semiconductor element 11 is placed on the substrate 10, the two can be regarded as a single structure combination. Therefore, when the high static voltage is in contact with a conductor or connected to the ground, the static electricity may cause damage to the product if it exceeds the electrostatic load limit of the semiconductor element 11.

For example, when conveying the package substrate strip, the electroplated buses 13 are exposed from the sides of the packaging substrate strip, and they would rub against the track. The static electricity accumulated in the dielectric body 100 may cause electrostatic discharge, which causes current to flow through the electroplated buses 13, current steering wires (disposed in the separation regions 1b to connect the electroplated buses 13 and the wiring layers 101), the wiring layers 101, and to the semiconductor elements 11. If the current is greater than the limit of electrostatic load of the semiconductor elements 11, the electrical function of the semiconductor elements 11 may be compromised or even the semiconductor elements 11 may be burnt and destroyed.

Furthermore, when the semiconductor element 11 is placed on the substrate 10 through wiring bonding or flip chip technology, during the molding process for forming the encapsulant 12, upper and lower metal molds will get separated very quickly during the demolding step, ESD may be created by the static electricity buildup in the dielectric body 100, which similarly causes current to flow through the electroplated buses 13, the current steering wires, the wiring layers 101, and to the semiconductor elements 11. If the current is greater than the limit of electrostatic load of the semiconductor elements 11, the electrical function of the semiconductor elements 11 may be compromised.

On the other hand, in order to address static electricity induced in the semiconductor elements 11 by the electroplated buses 13, elongated narrow open slots are milled in the separation regions 1b (a rectangle formed of dashed lines 14 shown in FIG. 1A') to remove the current steering wires in the separation regions 1b, thereby creating an open circuit between the electroplated buses 13 and the wiring layers 101. However, the packaging substrate strip is more susceptible to deformation due to these open slots. Also, the width of the open slot has to be larger than the width of the separation region 1b, reducing the area available for circuit layout on the die attach regions 1a and increasing the cost of the packaging process (e.g., increasing the number of layers of the substrate 10 to accommodate the number of wirings required).

Therefore, there is a need for a solution that addresses the aforementioned shortcomings in the prior art.

SUMMARY

In view of the aforementioned shortcomings of the prior art, the present disclosure provides a carrier structure defined with a retained region and a removal region adjoining each other. The carrier structure may include: a plurality of substrates provided in the retained region; a separation portion provided between the substrates in the retained region; and a periphery portion provided in the removal region and formed with at least one opening.

The present disclosure further provides a package structure, which may include: a carrier structure defined with a retained region and a removal region adjoining each other. The carrier structure may include: a plurality of substrates provided in the retained region, a separation portion provided between the substrates in the retained region, and a periphery portion provided in the removal region and formed with at least one opening; a plurality of electronic components each disposed on a respective substrate and electrically connected therewith; and an encapsulating layer formed on the retained region and encapsulating the plurality of electronic components.

In an embodiment, each of the substrates may include at least one wiring layer.

In an embodiment, an insulating layer may be formed on a surface of the periphery portion. In another embodiment, the opening may be formed in the insulating layer.

In an embodiment, an electrical conductor may be disposed in the opening. In another embodiment, the electrical conductor may penetrate or not penetrate through the periphery portion.

In an embodiment, the periphery portion may include a plurality of electroplated conductive wires electrically connected with the respective substrates. In another embodiment, at least two of the electroplated conductive wires may be connected to each other.

As can be understood from the above, the carrier structure and the package structure according to the present disclosure reduce the electrostatic charges on the substrates and control the electrostatic distribution of the substrates by essentially providing the openings and the electrical conductors in the periphery region. Thus, compared to the prior art, the carrier structure and the package structure according to the present disclosure not only prevent the ESD-generated current from exceeding the electrostatic load limit of the electronic component, but also avoid structural deformations of the carrier. Furthermore, the available layout areas of the substrates would not compromise, and the cost of the packaging process can thus be kept low.

BRIEF DESCRIPTION OF THE DRAWINGS

The present disclosure can be more fully understood by reading the following detailed description of the embodiments, with reference made to the accompanying drawings, wherein:

FIG. 1A' is a top view of FIG. 1A;

FIG. 2A' is a top view depicting a package structure in accordance with the present disclosure;

FIG. 2C' is another embodiment of FIG. 2C; and

DETAILED DESCRIPTION OF THE EMBODIMENTS

Figure 1A:
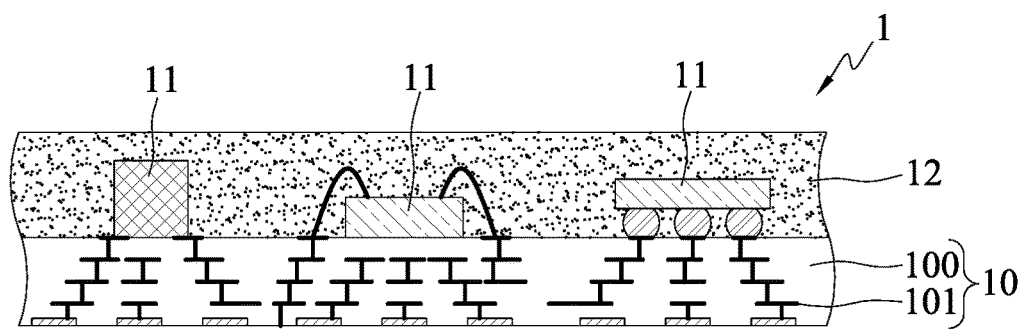
FIGS. 1A and 1B are cross-sectional schematic diagrams illustrating a conventional method for manufacturing a semiconductor package.
Figure 1A:
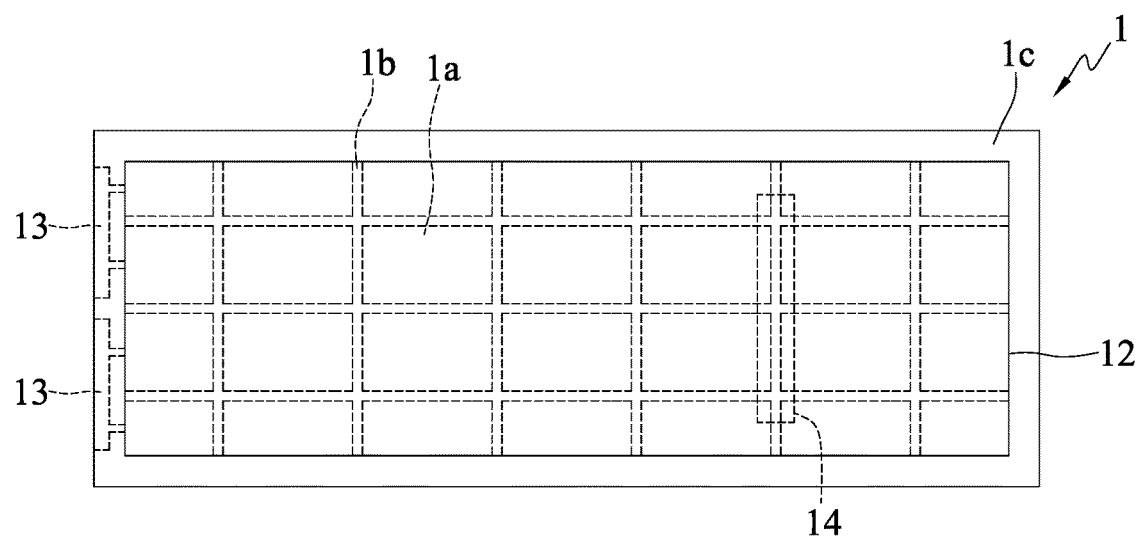
Figure 1B:
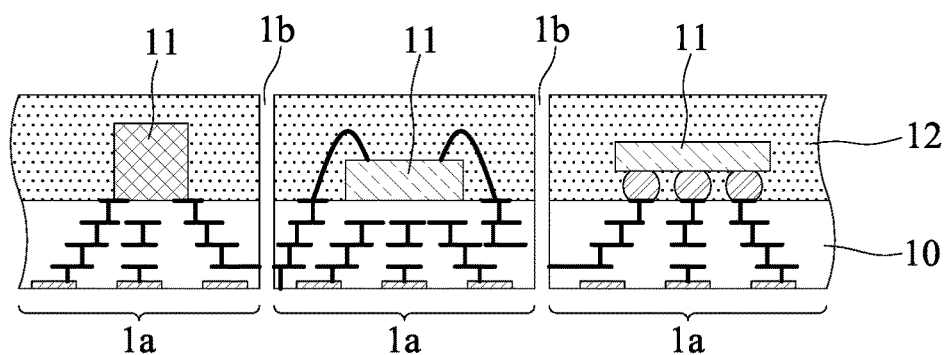

The technical content of the present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "first", "second", "one", "a", "an", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

Figure 2A:
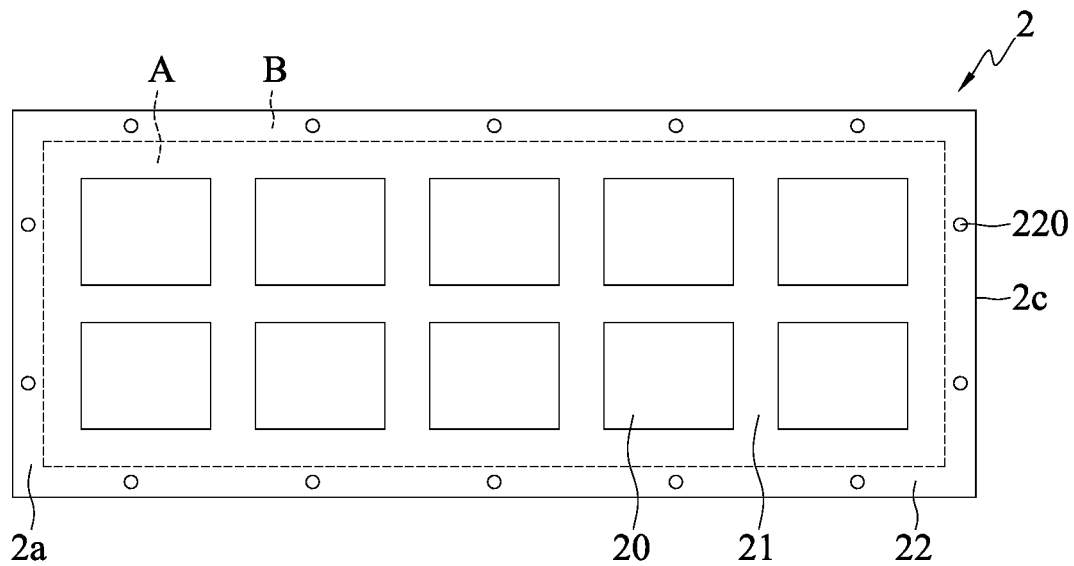
FIG. 2A is a top view depicting a carrier structure in accordance with the present disclosure.
Figure 2A:
Figure 2B:
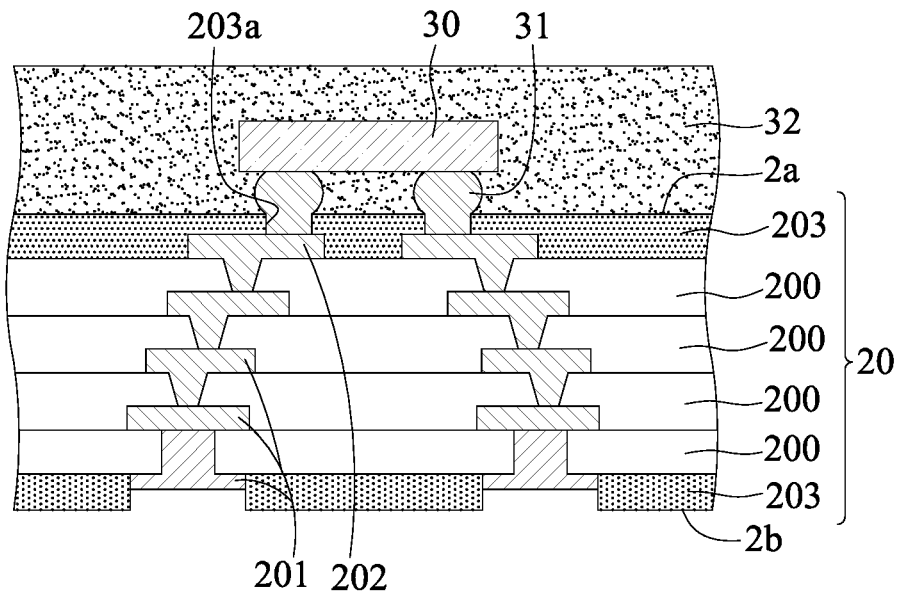
FIG. 2B is a partial cross-sectional diagram of FIG. 2A'.

Referring to FIGS. 2A and 2B, schematic diagrams depicting a carrier structure 2 in accordance with the present disclosure are shown. The carrier structure 2 is defined with a retained region A and a removal region B (boundary of the two are shown by dashed lines) adjoining each other. The carrier structure 2 includes a plurality of substrates 20 in the retained region A; separation regions 21 disposed between the substrates 20 in the retained region A; and a periphery region 22 in the removal region B and including at least one opening 220.

The carrier structure 2 can be in the form of a flat panel, such as a packaging substrate strip, and includes a first side 2a and a second side 2b opposite to each other and sides 2c adjoining the first side 2a and the second side 2b.

The substrates 20 are arranged in an array. As shown in FIG. 2B, each of substrates 20 can have a circuit layout with a core layer or a coreless circuit layout, and includes a plurality of dielectric layers 200 and wiring layers 201, such as fan-out redistribution layers (RDLs). In an embodiment, the substrate 20 is made of a dielectric material such as polybenzoxazole (PBO), polyimide (PI), a prepreg (PP), etc. It can be appreciated that the substrates 20 can be other carriers for carrying chips, such as organic sheets, semiconductor materials, or carriers containing other metal routings; and the present disclosure is not limited to the above.

In an embodiment, a wiring layer 201 has a plurality of electrical contact pads 202 at the first side 2a of the carrier structure 2, and a solder resist layer 203 (e.g., a solder mask or a dielectric material) of the substrate 20 is formed at the first side 2a of the carrier structure 2. The solder resist layer 203 is formed with a plurality of through holes 203a for exposing the electrical contact pads 202, such that an electronic component 30 can be connected to these electrical contact pads 202 via a plurality of electrical conductive elements 31.

The separation regions 21 are used as dicing paths in the singulation process and can be formed according to the manufacturing process and the structure of the substrate 20. In an embodiment, the separation regions 21 can be formed from the dielectric layers 200 and the solder resist layer 203. In another embodiment, the separation regions 21 are formed with current steering wires (not shown) electrically connected with the wiring layers 201.

The periphery region 22 is connected with the separation regions 21 and will be removed along with the removal region B in a subsequent trimming process. The periphery region 22 can also be formed according to the manufacturing process and the structure of the substrate 20. In an embodiment, the periphery region 22 is formed from the dielectric layers 200, and the surface of the periphery region 22 at the first side 2a of the carrier structure 2 is an insulating layer, such as the solder resist layer 203.

In an embodiment, the openings 220 are formed in the insulating layer of the periphery region 22, for example, formed in the solder resist layer 203.

Figure 2C:
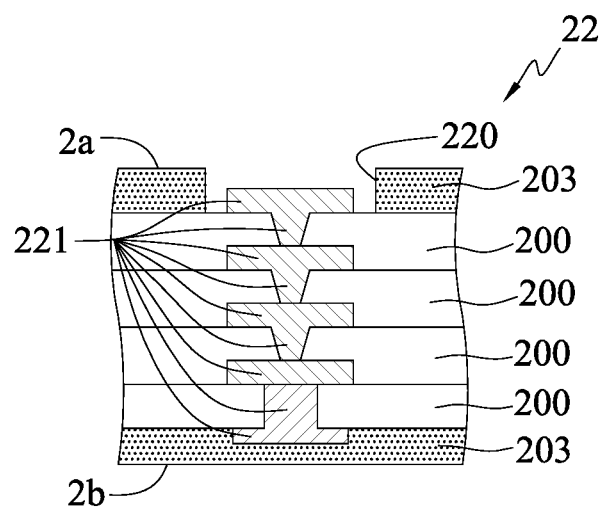
FIG. 2C is a partial cross-sectional diagram of FIG. 2A.
Figure 2C:
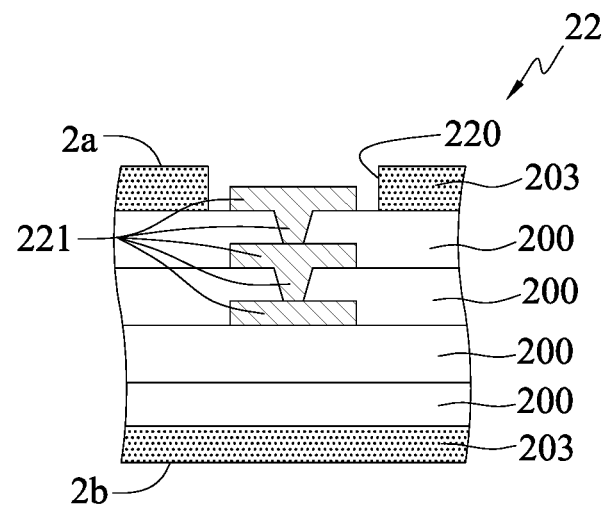

Moreover, electrical conductors 221 can also be formed in the openings 220 as shown in FIGS. 2C and 2C', and are not electrically connected with the wiring layers 201 and the electrical contact pads 202. In an embodiment, the electrical conductors 221 are disposed according to the manufacturing process and the structure of the substrate 20, for example, metal layers in the form of wires, conductive blind vias or pads can be formed in the dielectric layers 200. In another embodiment, the electrical conductors 221 penetrate the periphery region 22 (extending through all of the dielectric layers 200 as shown in FIG. 2C) or do not penetrate the periphery region 22 (extending through some of the dielectric layers 200 as shown in FIG. 2C') to control and adjust the distribution of the static electricity. In an embodiment, the static electricity can be distributed evenly throughout each of the dielectric layers 200 of the carrier structure 2 (or of the substrates 20).

Figure 2D:
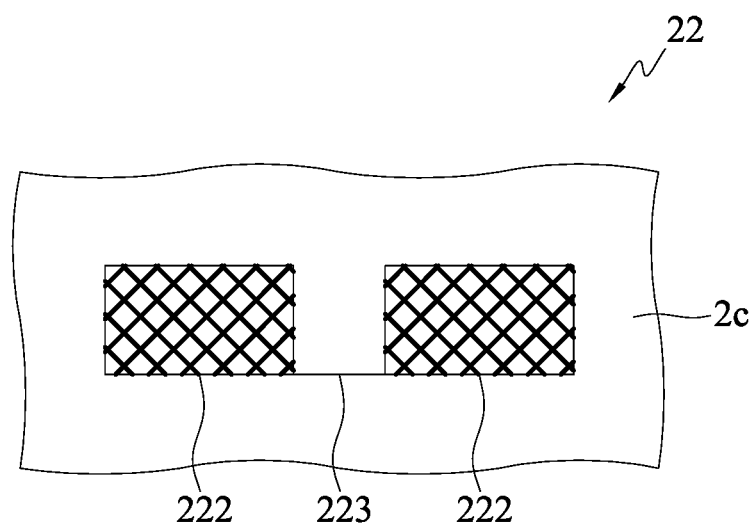
FIG. 2D is a partial cross-sectional diagram of FIG. 2A.

In an embodiment, the periphery region 22 includes a plurality of electroplated conductive wires 222, which can be electrically connected with the current steering wires in the separation regions 21 and are exposed from the sides 2c of the carrier structure 2. In another embodiment, the electroplated conductive wires 222 are shown as meshed boxes in FIG. 2D, and used as electroplated buses during the formation of the various wiring layers 201 of the substrate 20. Therefore, upon completion of the manufacturing of all of the substrates 20, the electroplated conductive wires 222 would be electrically connected to the wiring layers 201 of the respective substrates 20, while the electrical conductors 221 are not connected with the electroplated conductive wires 222. In an embodiment, at least two of the electroplated conductive wires 222 can be interconnected as needed, as shown in FIG. 2D, at a side 2c of the carrier structure 2, at least one extension lead 223 interconnects at least two electroplated conductive wires 222 to facilitate the gathering of static electricity in the periphery region 22 (the electroplated conductive wires 222 or the extension lead 223) in order to control and adjust the distribution of the static electricity. In an embodiment, the static electricity can be distributed evenly throughout each of the dielectric layers 200 of the carrier structure 2 (or of the substrates 20).

In an embodiment, a subsequent packaging process is carried out on the carrier structure 2 to form a package structure 3 as shown in FIGS. 2A' and 2B. In another embodiment, the package structure 3 is formed by first placing the electronic component 30 on the substrate 20 and electrically connecting it to the substrate 20, then forming an encapsulating layer 32 on the retained region A for encapsulating the electronic component 30. The encapsulating layer 32 may also be formed on the removal region B to cover the periphery region 22 if needed.

The encapsulating layer 32 is combined onto the first side 2a of the carrier structure 2 and can be made of an insulating material, such as polyimide (PI), a dry film, an epoxy, or a molding compound. Also, it can be formed on the first side 2a of the carrier structure 2 by lamination or molding. However, the material and the manufacturing method of the encapsulating layer 32 are not limited to the above.

Therefore, by providing the openings 220 in the periphery region 22 at the first side 2a of the carrier structure 2, the package structure 3 according to the present disclosure is capable of reducing the area of the insulating layer at the first side 2a of the carrier structure 2, thereby reducing the overall space for accumulating static electricity in the carrier structure 2. As such, during the packaging process, the buildup of the static voltage in the substrate 20 (e.g., the dielectric layers 200 and the solder resist layer 203) can be reduced, preventing the ESD-generated current from exceeding the electrostatic load limit of the electronic component 30 and thereby preventing product damage caused by ESD.

Moreover, the electrical conductors 221 are used charge steering paths for steering electrostatic charges towards the periphery region 22 via the openings 220. As a result, during the packaging process, the electrostatic buildup in the substrates 20 can be reduced and distributed among the periphery region 22 and the substrates 20, preventing large buildup of the static electricity in the retained region A or the substrates 20, and preventing the ESD-generated current from exceeding the electrostatic load limit of the electronic component 30, further lowering the risk of product damage caused by ESD during the manufacturing process.

Moreover, with the interconnecting configuration of the electroplated conductive wires 222, the electrostatic charges can be guided to concentrate in the periphery region 22, and the electrostatic buildup in the substrates 20 can thus be reduced during the manufacturing process. Furthermore, in the event of a current generated by ESD, short circuit is formed between the electroplated conductive wires 222, such that the ESD-generated current will not flow through the electronic component 30, lowering the risk of product damage caused by ESD during the manufacturing process.

In conclusion, the carrier structure and the package structure according to the present disclosure reduce the electrostatic charges on the substrates and control the electrostatic distribution of the substrates by essentially providing the openings and the electrical conductors in the periphery region. Thus, compared to the prior art, the carrier structure and the package structure according to the present disclosure not only prevent the ESD-generated current from exceeding the electrostatic load limit of the electronic component, but also avoid structural deformations of the carrier. Furthermore, the available layout areas of the substrates would not compromised, and the cost of the packaging process can therefore be kept low.

The above embodiments are used only to illustrate the principles of the present disclosure and its effect, rather than to limit the present disclosure. The above embodiments can be modified by one of ordinary skill in the art without departing from the spirit and scope of the present disclosure. Therefore, the scope claimed of the present disclosure should be defined by the following claims.

What is claimed is:

1. A carrier structure defined with a retained region and a removal region adjoining each other, the carrier structure comprising:
    a plurality of substrates provided in the retained region;
    a separation portion provided between the substrates in the retained region; and
    a periphery portion provided in the removal region and formed with at least one opening,
    wherein the periphery portion includes a plurality of electroplated conductive wires electrically connected with the substrates and exposed from a side surface of the carrier structure, and
    wherein at least two of the electroplated conductive wires are meshed boxes and connected to each other via at least one extension lead.

2. The carrier structure of claim 1, wherein the substrates each include at least one wiring layer.

3. The carrier structure of claim 1, further comprising an insulating layer formed on a surface of the periphery portion.

4. The carrier structure of claim 3, wherein the opening is formed in the insulating layer.

5. The carrier structure of claim 1, further comprising an electrical conductor disposed in the opening.

6. The carrier structure of claim 5, wherein the electrical conductor penetrates the periphery portion.

7. The carrier structure of claim 5, wherein the electrical conductor is free from penetrating the periphery portion.

8. A package structure, comprising:
a carrier structure defined with a retained region and a removal region adjoining each other, wherein the carrier structure includes:
- a plurality of substrates provided in the retained region;
- a separation portion provided between the substrates in the retained region; and
- a periphery portion provided in the removal region and formed with at least one opening, wherein the periphery portion includes a plurality of electroplated conductive wires electrically connected with the substrates and exposed from a side surface of the carrier structure, and wherein at least two of the electroplated conductive wires are meshed boxes and connected to each other via at least one extension lead;

a plurality of electronic components disposed on and electrically connected to the substrates; and an encapsulating layer formed on the retained region and encapsulating the plurality of electronic components.

9. The package structure of claim 8, wherein the substrates each include at least one wiring layer.

10. The package structure of claim 8, further comprising an insulating layer formed on a surface of the periphery portion.

11. The package structure of claim 10, wherein the opening is formed in the insulating layer.

12. The package structure of claim 8, further comprising an electrical conductor disposed in the opening.

13. The package structure of claim 12, wherein the electrical conductor penetrates the periphery portion.

14. The package structure of claim 12, wherein the electrical conductor is free from penetrating the periphery portion.

* * * * *